United States Patent [19]
Locanthi

[11] Patent Number: 5,568,100
[45] Date of Patent: Oct. 22, 1996

[54] SYNCHRONOUS POWER DOWN CLOCK OSCILLATOR DEVICE

[75] Inventor: Bart N. Locanthi, Beaverton, Oreg.

[73] Assignee: Lucent Technologies Inc., Murray Hill, N.J.

[21] Appl. No.: 532,186

[22] Filed: Sep. 22, 1995

[51] Int. Cl.⁶ .......................... H03B 5/06; H03K 3/012; H03K 3/014; H03L 3/00
[52] U.S. Cl. .......................... 331/74; 331/173; 331/175; 327/142; 327/161; 327/544
[58] Field of Search .......................... 331/57, 74, 145, 331/153, 172, 173, 175, 185; 327/142, 143, 161, 544

[56] References Cited

U.S. PATENT DOCUMENTS

| | | | |
|---|---|---|---|
| 3,947,697 | 3/1976 | Archer et al. | 327/142 X |
| 4,641,044 | 2/1987 | Shiraishi | 327/142 |
| 4,864,255 | 9/1989 | Yoshida | 331/173 X |
| 5,225,723 | 7/1993 | Drako et al. | 327/161 X |
| 5,369,311 | 11/1994 | Wang et al. | 327/143 X |
| 5,440,250 | 8/1995 | Albert | 327/142 X |

Primary Examiner—David Mis

[57] ABSTRACT

This invention provides a synchronous, power down oscillating device that provides only uniform pulses having no glitches at its output. The circuit is able to provide a synchronous output for two low power stand-by modes of a battery powered device. The circuit includes an oscillator that sends an oscillator signal to a synchronizing chain of D flip-flops. Input to the flip-flops is provided through an OR gate. The output of the flip-flops is logically ORed with the oscillator signal. The resultant output from the circuit is always a synchronized signal.

16 Claims, 4 Drawing Sheets

SYNCHRONOUS POWER DOWN CLOCK OSCILLATOR DEVICE

FIELD OF THE INVENTION

The invention relates to an oscillator-type device for managing power within a battery powered device.

BACKGROUND OF RELATED ART

A key component in most synchronous digital systems is the oscillator. Conventionally, oscillators provide clock pulses which drive digital components. Since power dissipation in digital systems is highly dependent on the number of times digital logic within such components switches from an ON to OFF or OFF to ON state, controlling the clock pulses supplied to digital systems is a technique often used to reduce power consumption of battery powered digital devices.

One method is to provide two oscillators as described in U.S. Pat. No. 5,155,840. A main oscillator outputs clock pulses for high speed operation of a digital device while a sub-oscillator, operating at a lower frequency, also outputs clock pulses. A selector is provided to switch between the outputs of the main oscillator and the sub-oscillator.

During normal operation, the output of the main oscillator is selected to drive the digital device. When the digital device is in a power reducing mode, the output of the sub-oscillator is selected so that the clock pulse frequency is reduced, thus reducing the digital device's power consumption.

However, while the sub-oscillator reduces the power consumption of the digital device, the power consumed even when the sub-oscillator is selected is often wasted. Further, the main oscillator continues to oscillate and consume power even when the sub-oscillator is selected.

SUMMARY OF THE INVENTION

An object of the present invention is to provide a clock oscillator device that can be disabled or powered down, whose output either oscillates or is quiescent, yet is at all times a valid clock signal.

The clock oscillator device comprises an oscillator and a clock output controller. The clock output controller combines input controls HALT and OFF with the oscillator signal to produce a clock signal that starts and stops synchronously with the oscillator signal. In addition, the clock output controller incorporates a time delay that allows the oscillator signal to stabilize before generating a clock signal.

The device has three operating modes: a normal mode, clock disable mode and "SLEEP" mode. In the normal mode, the device outputs a signal at a predetermined oscillation frequency. In the clock disable mode a non-oscillating signal is output at a constant voltage level. For TTL logic this could be a logical "1" or "0". When the device transitions from the normal mode to the clock disable mode, a signal output from the device ceases to oscillate at an oscillator signal edge so that the output remains fully synchronized with the oscillator signal. Likewise, when a HALT signal is received, the clock oscillator device outputs a signal with no glitches. Thus, no glitches are generated when transitioning from the clock disable mode to the normal mode and vice versa. In the SLEEP mode, the oscillator is powered down and no clock signal is generated.

BRIEF DESCRIPTION OF DRAWINGS

The invention will be described in detail with reference to the following drawings in which like reference numerals refer to like elements and wherein.

DETAILED DESCRIPTION OF PREFERRED EMBODIMENTS

Preferred embodiments of the present invention are described hereafter with reference to the drawings.

Figure 1:
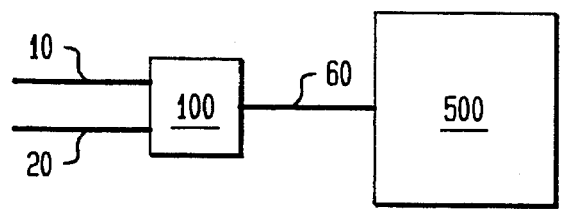
FIG. 1 is a block diagram illustrating an embodiment of the present invention in a battery powered system.

FIG. 1 is a block diagram showing implementation of a device according to one embodiment of the present invention. Logic states, 0 or 1, are sent through signal lines 10 and 20 to a device 100. Through processing within the device, a synchronous output signal is sent to host 500. As will be explained below, the elements within the device ensure that only uniform clock signals are output.

Figure 2:
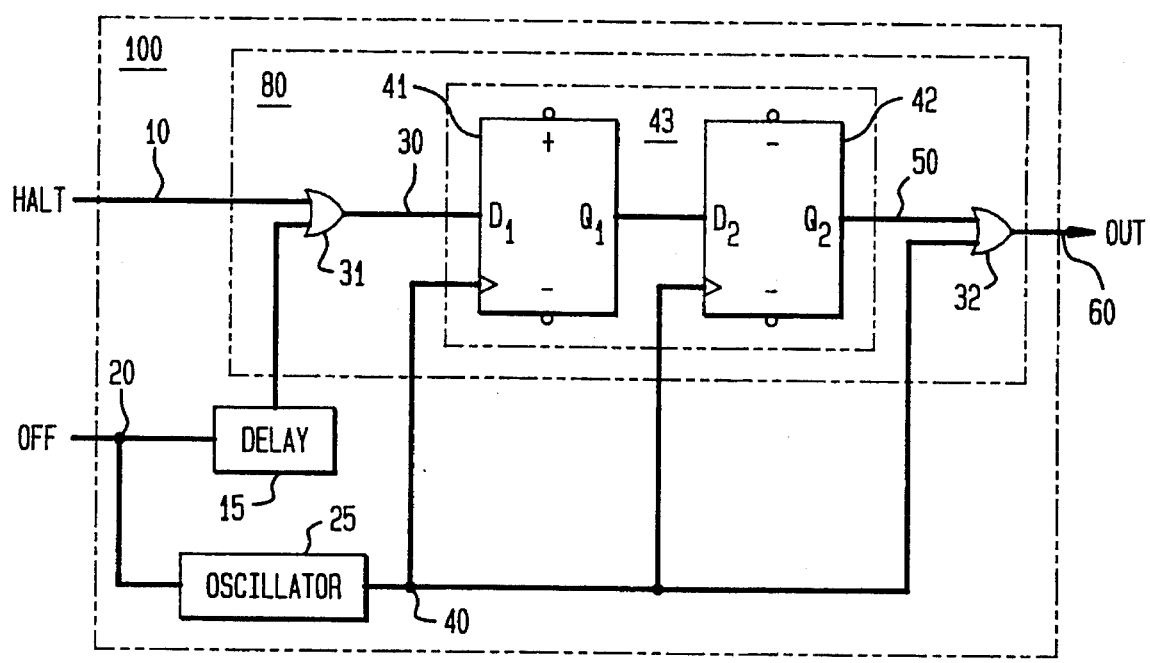
FIG. 2 is a detailed circuit diagram illustrating a clock oscillator device according to an embodiment of the present invention.

FIG. 2 is a circuit diagram illustrating the basic structure of one embodiment of the present invention.

In an embodiment of the present invention, the device 100 comprises a chip which uses a Transistor-Transistor-Logic (TTL) design. Historically, devices using TTL designs are the most inexpensive and readily available. The particular design may be selected based on the specific speed and power requirements of the system. It should be observed however, that this assumption is not intended to be limiting, and other IC designs, such as complementary-metal-oxide-silicon (CMOS) could also be employed.

The device 100 is controlled by a clock output controller 80. The clock output controller includes input logic circuitry 31, a signal synchronizer 43 and output logic 32. The input and output logic circuitry may comprise OR gates.

The synchronizer 43 comprises D flip-flops, 41 and 42, each having a single D input represented by $D_1$ and $D_2$, respectively. A flip-flop output Q1 is positive-edge triggered such that it will take on the current state of the D1 input only when the oscillator signal changes from a low to high voltage level. The output from $Q_1$ is sent to $D_2$. $Q_2$ is similarly enabled, at the leading edge of the oscillator signal. Flip-flops are useful in this application because they are bistable, thus producing a steady high or low output.

The operation of the clock oscillator device of the first embodiment in any mode is substantially as follows. A signal from signal line 20 reaches the oscillator 25 to generate or stop an oscillator signal. The OFF signal from signal line 20 also reaches a reset delay circuit 15. In the present invention a quiescent clock exists at logical "1". Both OFF and HALT are at logical 1 when asserted. The delay circuit 15 may be any conventional device that produces a finite, accurate time delay between a signal imposed on its input and the appearance of the signal at its output. The signal from the delay circuit 15 is logically ORed with the signal from signal line 10 at OR gate 31. The output from OR gate 31 is either an asserted DISABLE signal for preventing an oscillating output or a deasserted DISABLE signal for allowing an oscillating output. The signal is output at 30 to D flip-flop 41 and subsequently D flip-flop 42. The signal from this chain of flip-flops is output at 50 and is logically ORed with the oscillator signal from signal line 40. The result of this operation is output at 60 to Host 500.

The various operations of the device 100 shown in FIG. 2 will now be described.

Figure 3:
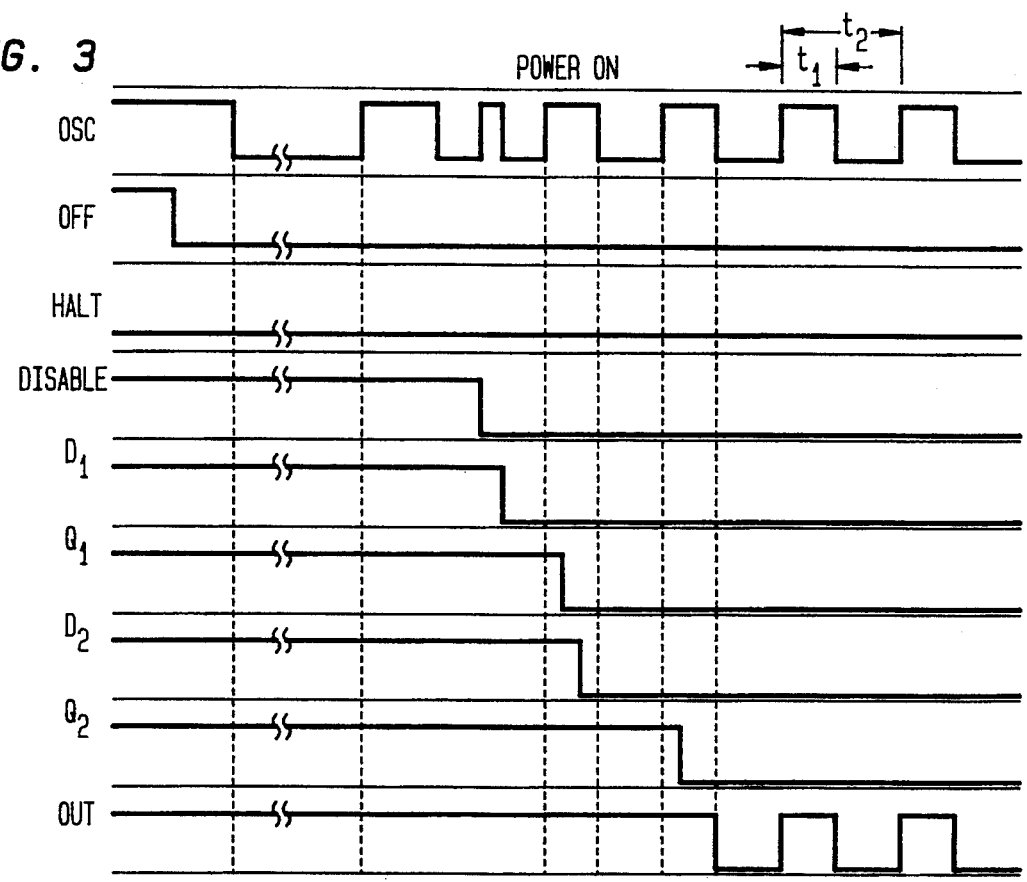
FIG. 3 is a timing diagram illustrating the power ON and subsequent normal operating mode of operation of an embodiment of the present invention.

FIG. 3 illustrates a timing diagram a power on operation and the subsequent normal operating mode for the first embodiment. Power on is achieved, when a logical "0" is sent through signal line 10. The deasserted OFF signal activates the oscillator 25 and reaches delay circuit 15. The delay circuit 15 ensures that the oscillator 25 is stable before the uniform output signal is generated. The HALT signal and the OFF signal are logically ORed at gate 31 and DISABLE is deasserted. The resultant signal is sent through signal line 30 and input to D flip-flop 41 at $D_1$. It is then output at $Q_1$ after the leading edge of the next oscillator signal is received at $D_1$. The result is then input to flip-flop 42 at $D_2$. The output at $Q_2$ follows the input after the next leading edge of the clock pulse. The oscillator signal from oscillator 25 controls the flip flops 41 and 42 through signal line 40.

The oscillator signal is logically ORed with the $Q_2$ output from flip flop 42 at gate 32. Because the $Q_2$ output follows the $D_2$ input only after the leading edge of an oscillator signal pulse, when $Q_2$ is held low, a uniform clock signal (OUT) having no glitches is synchronously enabled as shown by the timing diagram in FIG. 3.

As shown in FIG. 3, a pulse width is represented by t1 and a clock cycle by t2. From FIG. 3 it can be seen that the oscillator signal OSC does not begin with a uniform pulse. However, a delay caused by the reset delay circuit 15 allows the device to be enabled synchronously.

When the $D_1$ input is held low, $Q_2$ remains high until it also falls low after the leading edge of the OSC signal. Not until both the OSC signal and the $Q_2$ output are both low, will a uniform oscillating clock signal be output (OUT) from OR gate 32. Until this time the OUT signal is held high as shown in FIG. 3.

Figure 4:
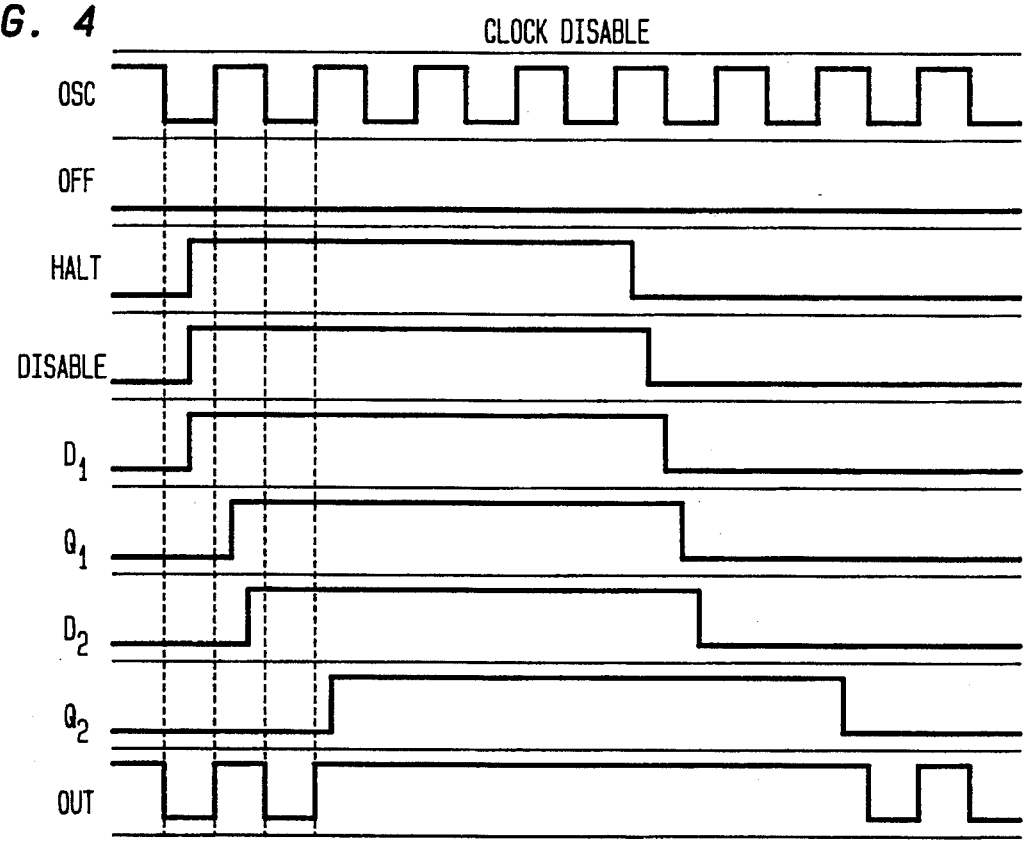
FIG. 4 is a timing diagram illustrating the clock disable mode according to an embodiment of the present invention.

In the clock disable mode, the first low power standby mode, the HALT signal is asserted. A resultant timing diagram for the first embodiment of the present invention is shown in FIG. 4.

The OR gate 31 receives the OFF signal from line 20 and the HALT signal from line 10. As a result, the OR gate generates a DISABLE signal and the D1 input is held high. The $Q_1$ output remains low until the leading edge of the OSC signal. Thereafter, the $Q_1$ output also goes high. After being input at $D_2$, the synchronizing signal is output at $Q_2$ after it receives the leading edge of an OSC signal. When a logical "1" from the $Q_2$ output is ORed with the OSC signal, the non-oscillating output is held high at 60.

In order to resume normal operation from the clock disable mode, HALT is deasserted. Upon deassertion of HALT, the input to OR gate 31 goes low. The deasserted HALT signal from signal line 10 is ORed with the deasserted OFF signal from signal line 20 to produce a low $D_1$ input. The $Q_1$ output goes low only after the leading edge of an oscillator signal pulse. The process is repeated at the $D_2$ input and $Q_2$ output of D flip-flop 42. An output from D flip-flops 41, 42 is ORed with the OSC signal at OR gate 32 to output a uniform clock signal having no glitches at 60.

Figure 5:
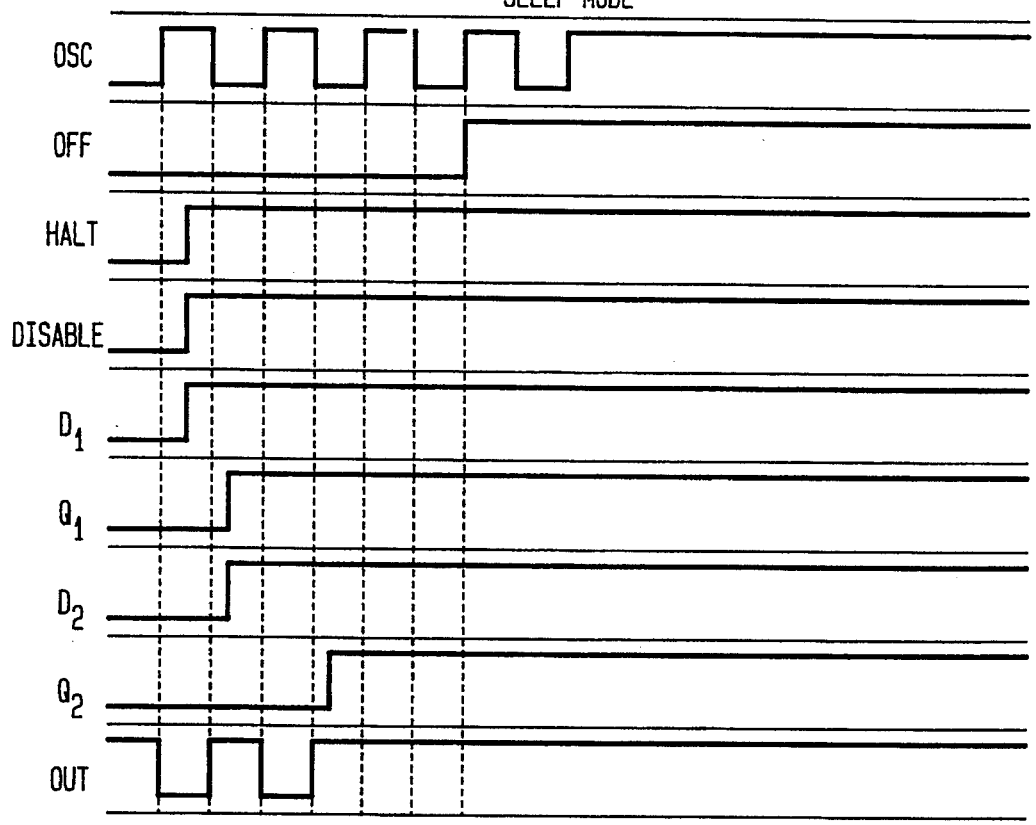
FIG. 5 is a timing diagram for the SLEEP mode according to an embodiment of the present invention.

In the SLEEP mode, the second low power standby mode, the OFF signal is asserted while the HALT signal is asserted. A timing diagram for the SLEEP mode for the first embodiment of the present invention is shown in FIG. 5. Upon assertion of the OFF signal, no oscillating signal is generated. When no oscillations occur, significant power savings result. The uniform clock output signal is stable from the initial assertion of the HALT signal and produces no asynchronous output.

While it appears that the same output would occur absent a second D flip-flop, it has been shown that the accuracy of the device goes up as the number of stages Therefore, two stages are provided to enhance the accuracy of the system, though more could be utilized as well.

Figure 6:
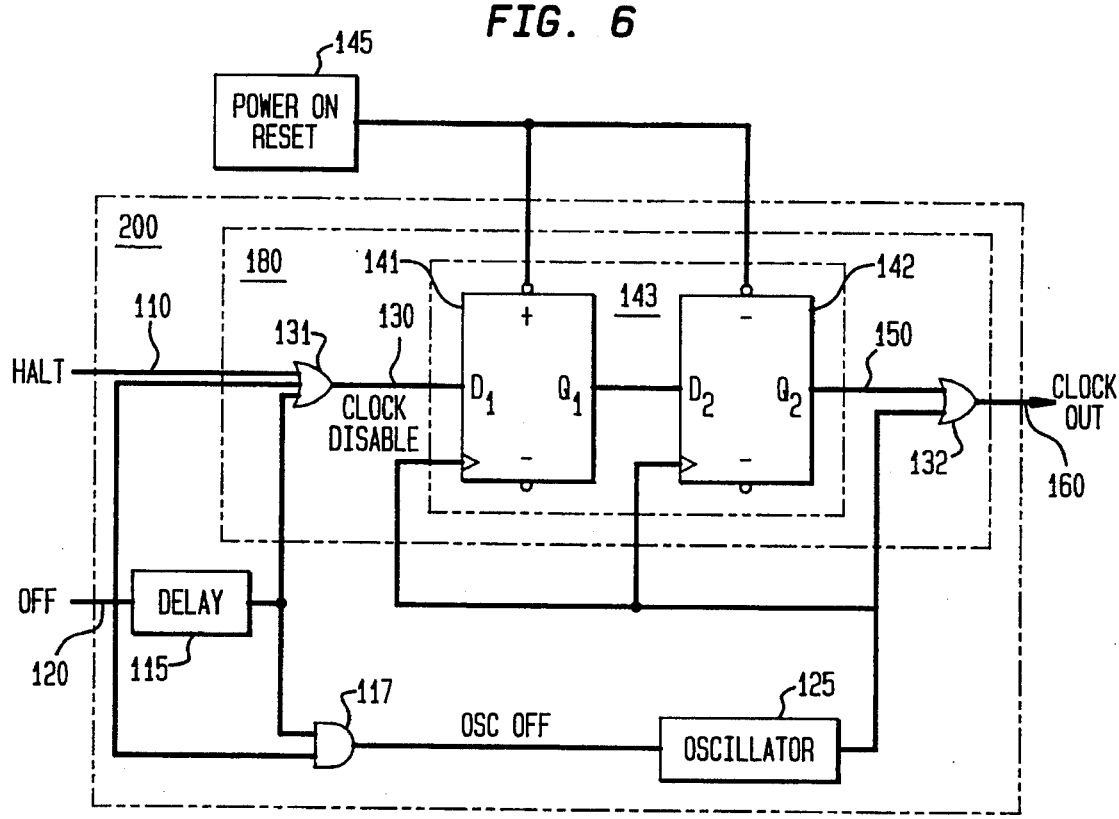
FIG. 6 is a detailed circuit diagram illustrating a clock oscillator device according to a second embodiment of the present invention.

A second embodiment of the present invention is illustrated in FIG. 6. The circuit of the second embodiment includes all the features of the first embodiment and also includes several additional features to enhance its reliability.

As in the first embodiment, HALT and OFF signals are sent to a clock output controller 180 that includes input logic 131, output logic 132, and signal synchronizer 143. A DIEABLE signal 130 is sent from input logic 131 to synchronizer 143. The synchronizer 143 includes first and second O flip-flops 141 and 142 respectively. An Oscillator 125 supplies its signal to the synchronizer 143 and to output logic 132.

Figure 7:
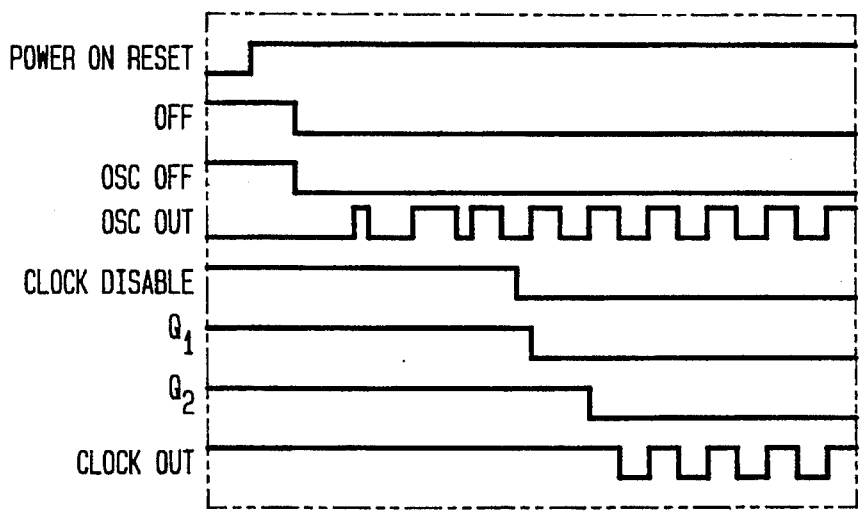
FIG. 7 is a timing diagram illustrating the power on and subsequent normal operating mode of an operation of the second embodiment of the present invention.
Figure 8:
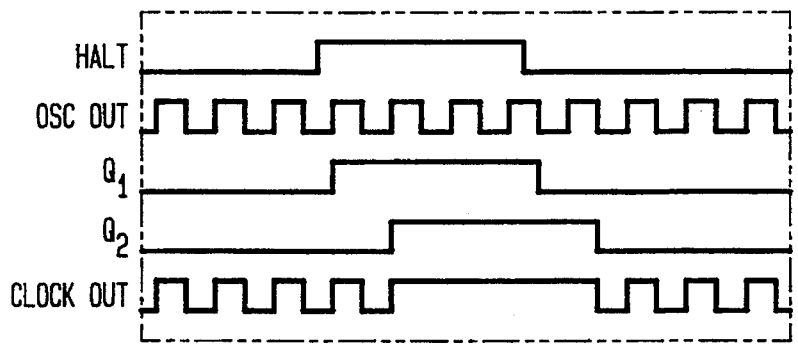
FIG. 8 is a timing diagram illustrating the clock disable mode according to the second embodiment of the present invention.

The second embodiment includes several features not found in the first embodiment. A power on reset circuit 145 is connected to both first and second flip flops 141 and 142. The reset circuit 145 initializes both flip flops prior to any operation of or input to the circuit. This reset operation prevents bad or nonuniform oscillator pulses from resulting in asynchronous clock outputs during power ON. The reset circuit is especially important during the initial power ON operation as illustrated in FIG. 7. Glitches are avoided through the addition of the power on reset circuit.

Figure 9:
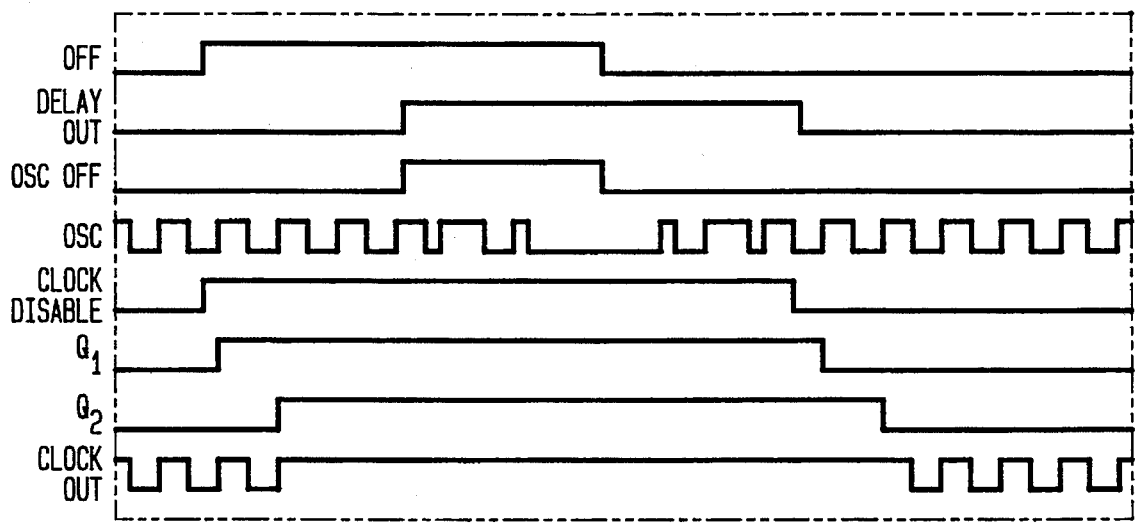
FIG. 9 is a timing diagram for the sleep mode according to the second embodiment of the present invention.

A second additional feature of the present embodiment is a third input signal line to clock output controller 180. In this instance, the input logic is a three input OR gate 131. The third input line is included to obviate the necessity of continuously asserting HALT during the SLEEP mode. The operation of the SLEEP mode for the second embodiment of the present invention is illustrated in FIG. 9.

A third additional feature included in the second embodiment of the present invention is oscillator controller 117. The oscillator controller ensures that the oscillator 125 is functioning normally when the clock output is turned on and off.

The timing diagrams 7–9 illustrate the power on, clock disable and SLEEP modes respectively for the second embodiment of the present invention. These modes are substantially similar to those described in relation to the first embodiment. The signals described in the first embodiment are identically labeled in the timing diagrams for the second embodiment. The additional signals for the power on reset and the OSC off are also appropriately labeled.

As explained above, the present invention produces a synchronous output whenever a mode change is implemented. Two low power stand-by modes, SLEEP and clock disable, are provided by the oscillator-type device of the present invention. By avoiding unnecessary oscillations, the device provides a significant savings of both power and time.

While this invention has been described in conjunction with specific embodiments thereof, it is evident that many alternatives, modifications and variations will be apparent to those skilled in the art. Accordingly, the preferred embodiments of the invention as set forth herein are intended to be illustrative, not limiting. Various changes may be made without departing from the scope of the invention as defined in the following claims.

What is claimed is:

1. A clock oscillator device, comprising:

an oscillator for generating an oscillator signal; and an clock output controller for generating a uniform clock signal using the oscillator signal, an OFF signal and a HALT signal, the uniform clock signal comprising one of a non-oscillating signal and an oscillating signal.

2. The clock oscillator device of claim 1, further comprising a delay circuit, the delay circuit generating a delay signal based on the OFF signal ensuring that the oscillator is stable before the uniform clock signal is generated.

3. The clock oscillator device of claim 1, wherein the oscillator output controller comprises:

a signal synchronizer;

input logic circuitry; and output logic circuitry, wherein the input logic circuitry generates a DISABLE signal based on the HALT signal and the DELAY signal, the signal synchronizer generates a synchronizing signal by synchronizing the DISABLE signal with the oscillator signal and the output logic circuitry generates the uniform clock signal based on the synchronizing signal and the oscillator signal.

4. The clock oscillator device of claim 3, wherein the signal synchronizer comprises at least one D-flip-flop, wherein the at least one D-flip-flop is serially connected.

5. The clock oscillator device of claim 3, wherein the input logic circuitry comprises an OR gate for logically ORing the halt signal and the DELAY signal and outputting the DISABLE signal.

6. The clock oscillator device of claim 3, wherein the output logic circuitry comprises an OR gate for ORing the synchronizing signal and the oscillator signal and for outputting the uniform clock signal.

7. The clock oscillator device of claim 3, wherein a power on reset circuit pre-sets the signal synchronizer.

8. The clock oscillator device of claim 1, wherein an oscillator controller receives the OFF signal and controls the oscillator.

9. A method for generating a uniform clock signal, comprising:

generating an oscillator signal;

generating the uniform clock signal based on the oscillator signal, a HALT signal and an OFF signal, wherein the uniform clock signal is comprised of one of a non-oscillating signal and an oscillating signal.

10. The method of claim 9, wherein generating the uniform clock signal further comprises generating a DELAY signal by delaying the OFF signal.

11. The method of claim 10, further comprising:

generating a DISABLE signal based on the HALT signal and the DELAY signal;

synchronizing the DISABLE signal with the oscillator signal thereby generating a synchronizing signal; and generating the uniform clock signal based on the synchronizing signal and the oscillator signal.

12. The method of claim 11, wherein the DISABLE signal is generated by logically ORing the HALT signal and the DELAY signal.

13. The method of claim 11, wherein synchronizing comprises:

serially connecting at least one D-flip-flop;

inputting the DISABLE signal into a D input of a first one of the serially connected at least one D-flip-flop;

connecting the oscillator signal to clock inputs of the at least one D-flip-flop; and generating the synchronizing signal by outputting a last Q output of the serially connected at least one D-flip-flop.

14. The method of claim 13, wherein synchronizing further comprises setting the at least one D flip-flop to a logical "1" prior to generating the synchronizing signal.

15. The method of claim 11, wherein the uniform clock signal is generated by logically ORing the synchronizing signal and the oscillator signal.

16. The method of claim 9, further comprising controlling the oscillator with an oscillator controller.

* * * * *